United States Patent [19]
Cherng et al.

[11] Patent Number: 5,719,089
[45] Date of Patent: Feb. 17, 1998

[54] METHOD FOR ETCHING POLYMER-ASSISTED REDUCED SMALL CONTACTS FOR ULTRA LARGE SCALE INTEGRATION SEMICONDUCTOR DEVICES

[75] Inventors: Meng-Jaw Cherng, Hsinchu; Pei-Wen Li, Kao-Hsiung, both of Taiwan

[73] Assignee: Vanguard International Semiconductor Corporation, Hsin-Chu, Taiwan

[21] Appl. No.: 668,991

[22] Filed: Jun. 21, 1996

[51] Int. Cl.⁶ .................................................. H01L 21/465
[52] U.S. Cl. .......................... 438/637; 438/700; 438/719; 438/723; 438/947; 438/696
[58] Field of Search ........................... 437/195, 186, 437/228, 233, 235, 238; 156/643.1; 438/637, 700, 719, 723, 947, 948, 949, 696

[56] References Cited

U.S. PATENT DOCUMENTS

| | | |
|---|---|---|
| 5,198,388 | 3/1993 | Kawai .................................. 437/173 |
| 5,279,989 | 1/1994 | Kim ..................................... 437/195 |
| 5,279,990 | 1/1994 | Sun et al. ............................. 437/195 |
| 5,444,021 | 8/1995 | Chung et al. ........................ 437/195 |
| 5,562,801 | 10/1996 | Nulty .................................. 156/643.1 |

Primary Examiner—John Niebling
Assistant Examiner—C. Everhart
Attorney, Agent, or Firm—George O. Saile; Stephen B. Ackerman

[57] ABSTRACT

A method for fabricating small contact openings in the polysilicon/metal 1 dielectric (PMD) layer on semiconductor substrates using polymer sidewall spacers was achieved. This extends the current photoresist resolution limits while simplifying the manufacturing process. The method involves depositing a polysilicon layer on the PMD layer and using a photoresist mask having openings over device contact areas in the substrate. The polysilicon layer is then patterned to form openings with vertical sidewalls to the PMD insulating layer. The contact openings are then anisotropically plasma etched in a gas mixture that simultaneously forms polymer sidewall spacers on the sidewalls in the openings in the polysilicon layer. These sidewall spacers further reduce the contact opening size. The remaining photoresist layer and polymer sidewall spacers are simultaneously removed to complete the narrow contact openings. This method eliminates the need to use an additional deposition and etch-back step to form the sidewalls. A metal layer is then deposited and patterned to form the metal contacts and first level of interconnections.

25 Claims, 2 Drawing Sheets

METHOD FOR ETCHING POLYMER-ASSISTED REDUCED SMALL CONTACTS FOR ULTRA LARGE SCALE INTEGRATION SEMICONDUCTOR DEVICES

BACKGROUND OF THE INVENTION (1) Field of the Invention

This invention relates to semiconductor integrated circuit devices, and more specifically to a method for forming very small (sub-half-micrometer) contacts to semiconductor devices for Ultra Large Scale Integrated (ULSI) circuits. The method utilizes the formation of a polymer during the plasma etching of the contacts to further reduce the size of the contact openings beyond the photolithographic minimum feature size.

(2) Description of the Prior Art

As the integrated circuit density on semiconductor substrates has dramatically increased by downsizing of the individual devices built in and on the semiconductor substrate, there is a strong need to further reduce the minimum feature sizes on Ultra Large Scale Integration (ULSI) circuits. One area that limits the minimum feature size is the resolution of the photolithographic technology. More specifically, to increase the circuit density, it is desirable to form reliably very small electrical contacts to the semiconductor substrate for contacting and interconnecting the semiconductor devices, such as to the source/drain areas of field effect transistors (FETs). However, the contact size is limited by the resolution of the current photolithographic technology, and therefore it is desirable to find additional methods for reducing the size of the contact openings to the semiconductor devices on the substrate.

One method of making reliable contacts that exceed photolithographic resolution limits is described by J. Kim, U.S. Pat. No. 5,279,989. Kim's method involves the use of an oxide layer etched back to form oxide sidewall spacers in a partially etched contact opening to further reduce the size of the contact. Thereby Kim extends the resolution of the photolithographic technique. Another method for making a small geometry contact opening using sidewall spacers is described by S. W. Sun et al. in U.S. Pat. No. 5,279,990. In Sun's method, a polysilicon layer is etched back to form a sidewall spacer in a partially completed contact opening. The polysilicon sidewall is then used to reduce the contact opening that is etched in the thick insulating layer composed of borophosphosilicate glass (BPSG).

Unfortunately, the methods described above require additional processing steps that add to the cost of fabricating the integrated circuits. Therefore, there is a need for further reducing the size of the contacts using the current photoresist resolution while providing a simpler fabrication process.

SUMMARY OF THE INVENTION

Accordingly, it is a principal object of this invention to provide a method for making electrical contact structures having very small contact openings.

It is another object of the present invention to provide a method for forming these small contact openings exceeding the current optical photolithographic resolution.

It is still another object of the invention to fabricate these very narrow contact openings on semiconductor substrates using a simplified process that is manufacturing cost effective.

Now in accordance with the objectives of this invention, a method is described for forming very small contacts to semiconductor substrates for ULSI circuits. The method uses an anisotropic plasma etch to form the contact openings while concurrently forming a buildup of a polymer layer as a blocking layer on the sidewalls of openings in a polysilicon layer. The polymer buildup forms polymer sidewall spacers that mask the anisotropic plasma etching along the sidewalls of the openings in the polysilicon layer, thereby reducing the size of the contact openings etched in the underlying insulating layer. This allows the formation of contact openings that are smaller in feature size than is achievable by the photoresist resolution, thereby extending the packing density of devices on ULSI circuits. The method also achieves this result without requiring additional deposition and etchback steps to form the sidewall spacers used in the prior art, and therefore reduces manufacturing cost. Further, the method provides contact openings that are wider in the top polysilicon layer, thereby making it easier to fill the contact openings with metal without forming metal voids, as commonly occurs in the prior art. After depositing the metal, the metal layer and polysilicon layer are patterned to form the first level of interconnections.

The method for fabricating these small contact openings for electrical contacts and the metal interconnections on semiconductor substrates for integrated circuits begins by providing a semiconductor substrate having semiconductor devices and device contact areas in and on the surface of the substrate. An insulating layer, commonly referred to in the industry as the polysilicon/metal 1 dielectric (PMD), is then deposited on the substrate to electrically insulate the devices from the next level of interconnections. Preferably the insulating layer is composed of a borophosphosilicate glass (BPSG) and is made more planar by annealing. A polysilicon layer is deposited, for example, by low pressure chemical vapor deposition (LPCVD) on the insulating layer. A photoresist layer is then spin coated over the polysilicon layer, and openings are defined, using conventional photolithographic means, in the photoresist layer over the device contact areas where metal, polysilicon, or salicide contacts are desired. The openings in the photoresist layer have essentially vertical sidewalls. A first anisotropic plasma etch is used to etch openings in the polysilicon layer down to the insulating layer. The openings in the polysilicon also have vertical sidewalls aligned to the sidewalls of the photoresist layer.

An important feature of this invention is now achieved by a second anisotropic plasma etching for forming the contact openings in the insulating layer to the device contact areas on the substrate. The second anisotropic etching involves using a gas mixture that concurrently forms a non-volatile polymer layer (blocking layer) on the sidewalls of the openings in the polysilicon layer while anisotropically etching contact openings in the insulating layer. The deposition of the polymer layer forms polymer sidewall spacers on the sidewalls of the openings of the polysilicon layer, thereby reducing the width of the contact openings in the insulating layer. By this method, the contact openings are narrower than the openings through the photoresist layer, thereby extending the resolution of the current photoresist technology. After completing the second anisotropic etch, the polymer sidewall spacers and the remaining photoresist layer are removed simultaneously by plasma ashing, such as in an oxygen ambient.

One method of forming metal contacts in the contact openings and concurrently forming the conducting metal interconnecting layer follows. A barrier layer, such as a refractory metal, is conformally deposited in the contact openings and elsewhere on the substrate. Then a metal conducting layer is deposited. The conducting metal layer, the refractory metal layer, and the polysilicon layer are then patterned using conventional photolithographic techniques and plasma etching to form the first level of electrical interconnections having metal contacts in the contact openings. For example, a refractory metal alloy such as titanium/tungsten (TiW) or titanium/nitride (TiN) can be used for the barrier layer, and aluminum/copper (AlCu) alloy for the metal conducting layer.

It should be obvious to one with ordinary skill in the art that other methods can be used to form the metal contacts and metal interconnections in and on the contact openings formed by the method of this invention. For example, refractory metal plugs such as tungsten (W) can be used in the contact openings and a separate conducting metal used to form the electrical interconnections.

DESCRIPTION OF THE PREFERRED EMBODIMENTS

Now in keeping with the objects of this invention, the detailed method is described for forming reduced small contacts to device contact areas on semiconductor substrates. Although the method is described for silicon substrates, it is not limited thereto. The method utilizes an anisotropic plasma etch which simultaneously forms polymer sidewall spacers. This further reduces the size of the contact openings, and thereby extends the resolution of the current photolithographic resolution. The invention is then used to make one type of metal contact and interconnecting metal lines using a single metal layer. However, it should also be well understood by one skilled in the art that the method of this invention can be equally applied to other types of metallurgy, such as the formation of metal plugs, polysilicon plugs, or salicide, and then separately forming the metal interconnections.

Figure 1:
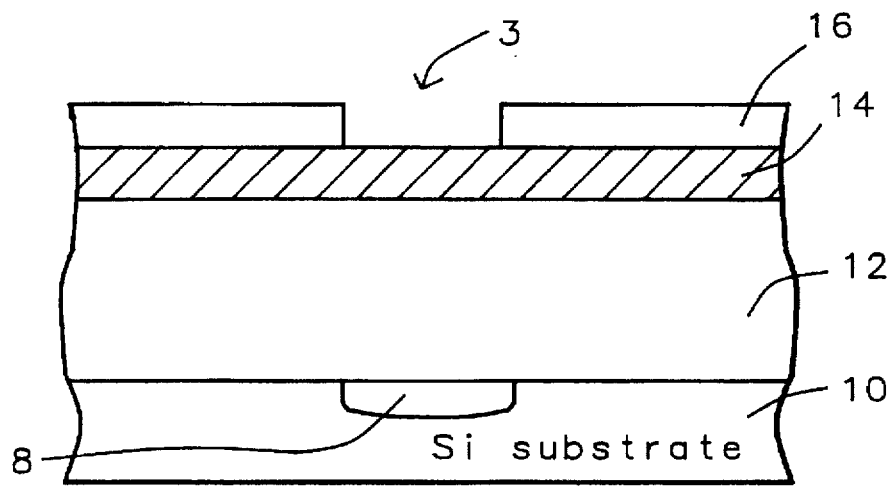
FIGS. 1 through 6 show schematic cross-sectional views of the contact opening structure at consecutive stages of processing according to the preferred embodiment of this invention. Also shown is one method of forming the metal contact and conducting metal interconnections.

Referring to FIG. 1, the method of this invention starts by providing a silicon substrate 10. For example, the substrate 10 is preferably composed of a P-type single crystal silicon having a <100> crystallographic orientation. Although the method is depicted in FIGS. 1–6 for a single device contact 8, it should be well understood that typically, in the semiconductor industry, a multitude of semiconductor devices are formed in and on the substrate surface having device contact areas, and a multitude of electrical contacts are made thereto. Therefore, for the sake of simplifying the drawings and discussion, only one contact opening to the device contact area 8 is shown in FIGS. 1–6.

Still referring to FIG. 1, an insulating layer 12 is deposited on the substrate 10 to electrically insulate the devices formed in and on the substrate from the next level of interconnections. This layer 12 is commonly referred to as the polysilicon/metal 1 dielectric (PMD) layer, and it electrically insulates the devices formed in part from patterned polysilicon layers on the substrate from the first level of interconnecting metallurgy. Preferably insulating layer 12 is composed of a silicon oxide ($SiO_2$) or a low-flow-temperature doped oxide, such as a borophosphosilicate glass (BPSG). For example, the BPSG can be deposited by using low pressure chemical vapor deposition (LPCVD) using silane ($SiH_4$) and oxygen ($O_2$) as the reactant gases and adding dopant gases such as phosphine ($PH_3$) and diborane ($B_2H_6$) during deposition. Layer 12 is then smoothed by using a thermal anneal. An alternate method for forming the low-flow-temperature glass is by LPCVD using the decomposition of tetraethylorthosilicate (TEOS) which can also be doped with phosphorus (P) and boron (B) to provide a low reflow temperature. Preferably the thickness of layer 12 is between about 2000 and 15000 Angstroms. After deposition, layer 12 is made more planar by annealing, for example, typically in a temperature range of between about 800° and 950° C. Still another method for forming layer 12 is to deposit an undoped silicon oxide ($SiO_2$) layer which can then be chemical/mechanically polished to provide global planarization.

Next, as shown in FIG. 1, a polysilicon layer 14 is blanket-deposited on the insulating layer 12. Preferably the polysilicon layer 14 is deposited by low pressure chemical vapor deposition (LPCVD) using a reactant gas such as silane ($SiH_4$). The LPCVD deposition is typically carried out at a temperature in the range of between about 580° and 650° C. Polysilicon layer 14 is preferably doped, but an undoped polysilicon layer can also be used. The thickness of layer 14 is preferably in the range between about 1000 and 4000 Angstroms, and more specifically has a value of about 3000 Angstroms.

Still referring to FIG. 1, a photoresist layer 16 is spin coated on the substrate and is patterned using conventional photolithographic techniques to form openings having essentially vertical sidewalls and aligned over the device areas on the substrate. For example, one opening 3 in FIG. 1 is shown aligned over device area 8. Preferably photoresist layer 16 is deposited having a thickness between about 7000 and 15000 Angstroms. One type of photoresist that can be used for this purpose is type PF38, which is manufactured by the Sumitomo Company of Japan.

Figure 2:
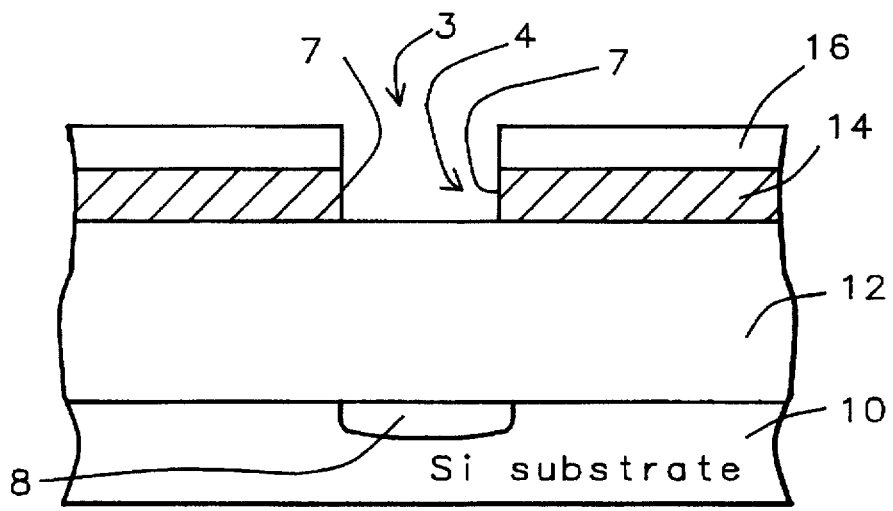

Referring next to FIG. 2, using the patterned photoresist layer 16 as the etch mask, a first anisotropic plasma etch is carried out to form openings 4 in the polysilicon layer 14 down to the insulating layer 12. The preferred etching can be performed, for example, in a reactive ion etcher (RIE) using an etchant gas mixture containing chlorine (Cl) species. For example, a chlorine/hydrogen bromide ($Cl_2$/HBr) gas mixture having a flow rate of 420 sccm and 80 sccm, respectively, can be used with a carrier gas such as helium (He). The opening 4 in polysilicon layer 14 is patterned having essentially vertical sidewalls 7 which are aligned with the sidewalls of the opening 3 in the photoresist layer 16.

Figure 3:
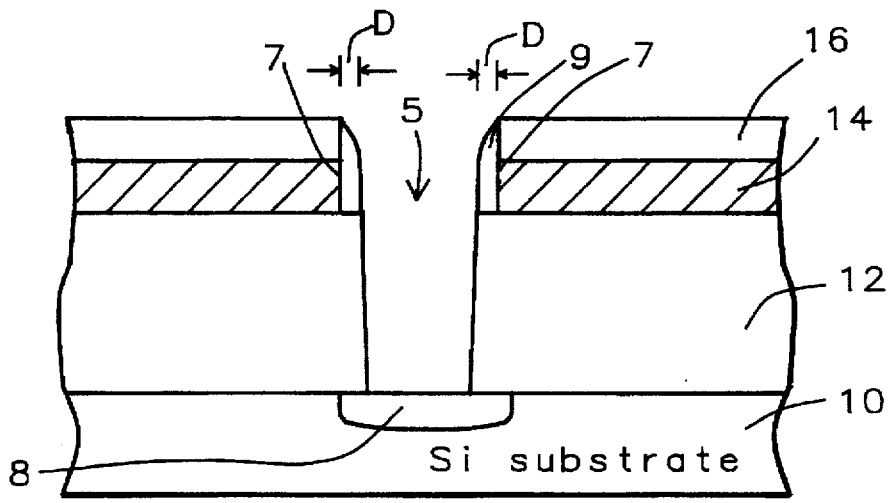

Referring now to FIG. 3, the contact opening 5 is then etched in the insulating layer 12 to the device contact areas 8 on the substrate 10 having widths (or diameters) which are reduced in size from the opening 3 in the photoresist layer 16, as shown in FIG. 2. This important feature of the invention is achieved by using an etchant gas mixture which simultaneously forms a spacer 9 composed of a non-volatile polymer layer on the sidewalls 7 of the opening 4 in the polysilicon layer 14, while anisotropically etching the insulating layer 12. The preferred etching is performed in a plasma etcher, such as a reactive ion etcher (RIE), and the preferred gas mixture used for etching is composed of argon (Ar), trifluoromethane ($CHF_3$), carbon tetrafluoride ($CF_4$), and nitrogen ($N_2$). The nitrogen is added to the etchant gas to smooth the surface of the etch profile. This second anisotropic plasma etch is performed in a reactive ion etcher having a downstream/triode design, such as manufactured by the Tokoyo Electronics Ltd. of Japan. The polymer layer formed is principally composed of a hydrocarbon containing silicon and fluorine (C-H, Si, F). The preferred flow rate for the Ar is between about 450 and 550 standard cubic centimeters per minute (sccm), the flow rate of the $CHF_3$ is between about 20 and 50 sccm, the flow rate of the $CF_4$ is between about 20 and 50 sccm, and the flow rate of the $N_2$ is between about 0.0 to 10 sccm.

By way of example only, if the polysilicon layer 14 is 3000 Angstroms thick and the flow rates of Ar, $CHF_3$, $CF_4$, and $N_2$ are respectively 500, 35, 35, and 10 sccm, then the resulting polymer sidewalls 9, as shown in FIG. 3, have a width D of about 0.15 micrometers (um). Therefore, if the width (or diameter) W of the opening 3 in the photoresist layer 16 is 0.5 um, then the opening 5 in the insulating layer 12 is reduced to a width W-2D, which is about 0.2 um. Therefore the contact opening 5 is significantly less than the opening in the photoresist layer.

Still referring to FIG. 3, the width D of the polymer sidewall spacer 9 can be controlled by adjusting the flow rates of the etching gases, thereby controlling the size of the contact opening 5 in the insulating layer 12. For example, by increasing the flow rate for $CHF_3$ from 35 sccm to between about 40 and 50 sccm and decreasing the flow rate of $CF_4$ from 35 sccm to between about 20 and 30 sccm, and Ar and $N_2$ having the previous flow rates of 500 sccm and 0 to 10 sccm, respectively, the width D of the polymer sidewall spacer 9 can be decreased to between about 0.15 and 0.07 um. On the other hand, if the $CHF_3$ flow rate is reduced from 35 sccm to about 20 to 30 sccm and the $CF_4$ flow rate is increased from 35 to between about 40 and 50 sccm, and Ar and $N_2$ remaining at 500 sccm and 0 to 10 sccm, respectively, then the width D of the polymer sidewall spacer 9 can be increased to between about 0.15 and 0.3 um.

Figure 4:
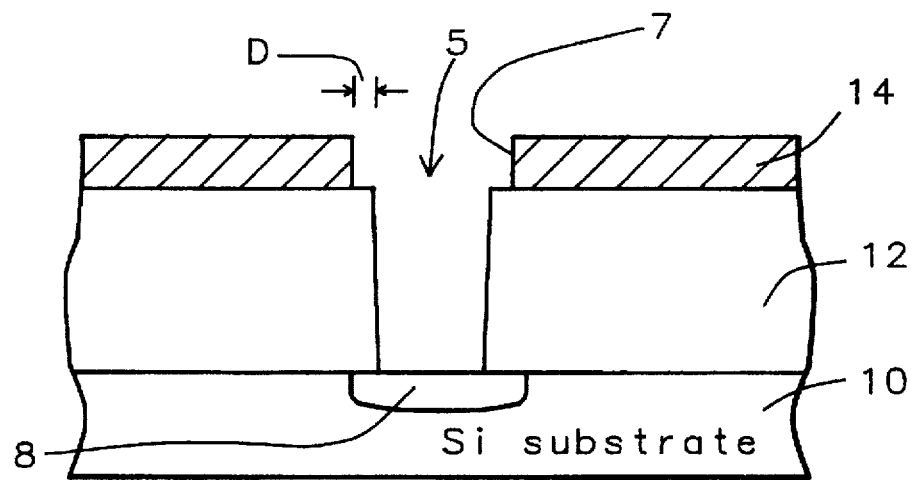

Referring now to FIG. 4, the polymer sidewall spacers 9 and the remaining photoresist layer 16 are removed simultaneously by plasma ashing, for example, using oxygen. This then completes the formation of the reduced contact openings 5 using the polymer spacers.

Figure 5:
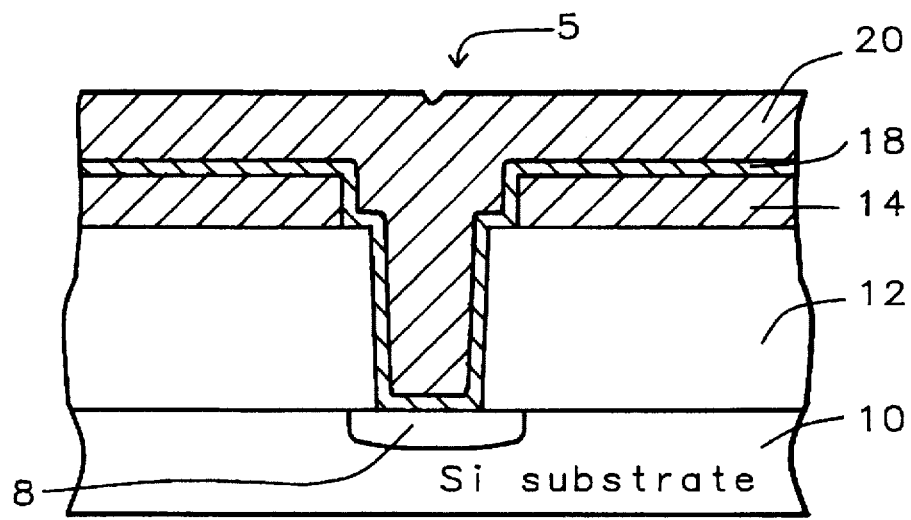
Figure 6:
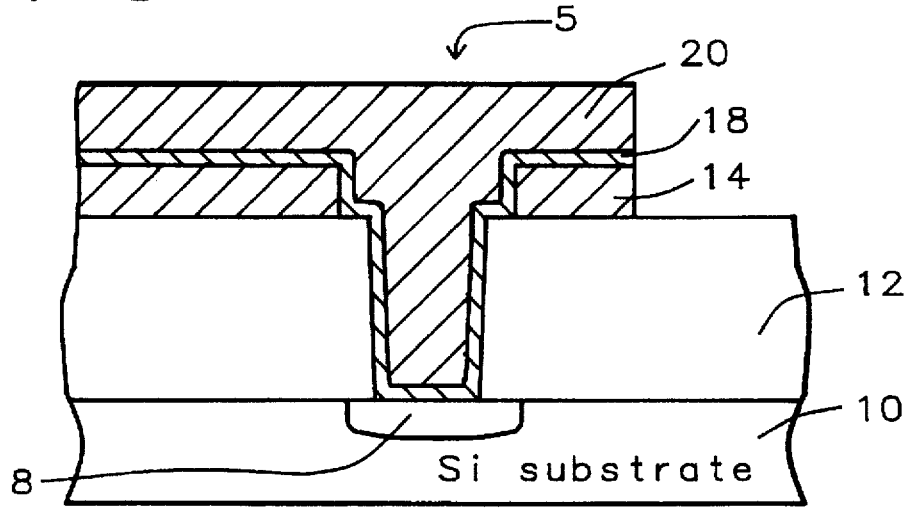

Metal contacts in these reduced contact openings 5 and the interconnecting metal lines thereon are now formed to complete the first level of metal interconnections, as shown in FIGS. 5 and 6. Although metal contacts are described, other types of contacts, such as polysilicon plugs, can also be used. Only one method of forming the metal contacts and interconnections using a barrier metal layer and a single conducting layer is described. However, it should be well understood that other methods, such as metal plug technology, can be employed to form the metal contacts and a separate patterned metal layer used to form the interconnections.

Referring more specifically to FIG. 5, a barrier metal layer 18 is conformally deposited in the contact opening 5 and the polysilicon layer 14 to prevent the diffusion of the metal conducting layer into the silicon contacts on the substrate. Preferably barrier layer 18 is composed of a refractory metal alloy such as tungsten (W) or titanium/tungsten (TiW). For example, tungsten can be deposited by low pressure chemical vapor deposition (LPCVD) using a reactant gas such as tungsten hexafluoride ($WF_6$). Another metal barrier layer that can be used is titanium/nitride (TiN). Preferably the thickness of the barrier layer 18 is between about 200 and 1200 Angstroms.

Still referring to FIG. 5, a conducting metal layer 20 is deposited over the barrier metal layer 18. Preferably the conducting layer 20 is composed of aluminum (Al). One method of depositing the Al to fill the narrow contact openings is the use of chemical vapor deposition (CVD) using the thermal decomposition of triisobutyl aluminum (TIBA). A more recent method of filling narrow contact openings is by the use of high pressure extruded Al. See, for example, the paper entitled "Application of High Pressure Extruded Aluminum to ULSI Metallization" by G. A. Dixit et al., Semiconductor International, pages 79–86, August 1996. One advantage of this method is that Al alloys can be used to fill the narrow contact openings 5 having high aspect ratios. Typically the Al alloy is deposited to a thickness of between about 2000 and 8000 Angstroms.

Finally, as shown in FIG. 6, the first level of metal interconnections and the metal contacts are now completed using the improved contact openings 5 fabricated by the method of this invention. The Al conducting metal layer 20, the refractory metal layer 18, and the polysilicon layer 14 are then patterned using conventional photolithographic techniques and plasma etching to form the first level of electrical interconnections having metal contacts in the contact openings.

While the invention has been particularly shown and described with reference to the preferred embodiments thereof, it will be understood by those skilled in the art that various changes in form and details may be made without departing from the spirit and scope of the invention.

What is claimed is:

1. A method for fabricating electrical contact openings on semiconductor substrates for integrated circuits, comprising the steps of:

providing a semiconductor substrate having device contact areas in and on the surface of said substrate;

depositing an insulating layer on said substrate;

depositing a polysilicon layer on said insulating layer;

forming a photoresist layer on said polysilicon layer;

forming openings in said photoresist layer to said polysilicon layer over said device contact areas on said substrate;

using a first anisotropic plasma etch to etch said polysilicon layer to said insulating layer in said photoresist openings, and thereby forming openings having vertical sidewalls in said polysilicon layer;

performing a second anisotropic plasma etch to etch said insulating layer exposed in said polysilicon openings using an etchant gas mixture that concurrently deposits a polymer layer forming polymer sidewall spacers on said polysilicon layer sidewalls, thereby forming contact openings in said insulating layer to said substrate surface having reduced sizes, said contact openings being less in size than said openings in said photoresist layer;

removing concurrently said polymer sidewall spacers and remaining portions of said photoresist layer by plasma ashing in oxygen, and thereby completing said electrical contact openings on said substrate.

2. The method of claim 1, wherein said insulating layer is composed of borophosphosilicate glass (BPSG) having a thickness of between about 2000 and 15000 Angstroms.

3. The method of claim 2, wherein said insulating layer is leveled by annealing at a temperature of 800° to 900° C. for about 15 to 30 minutes.

4. The method of claim 1, wherein said polysilicon layer has a thickness of between about 1000 and 4000 Angstroms.

5. The method of claim 1, wherein said photoresist layer has a thickness of between about 8000 and 10000 Angstroms.

6. The method of claim 1, wherein said second anisotropic plasma etch gas mixture is composed of argon (Ar), trifluoromethane ($CHF_3$), carbon tetrafluoride ($CF_4$) and nitrogen ($N_2$).

7. The method of claim 6, wherein said argon (Ar) has a flow rate of between about 450 and 550 standard cubic centimeters per minute (sccm), said trifluoromethane ($CHF_3$) has a flow rate of between about 20.0 and 50.0 sccm, said carbon tetrafluoride ($CF_4$) has a flow rate of between 20.0 and 50.0 sccm, and said nitrogen ($N_2$) has a flow rate of between about 0 and 10.0 sccm.

8. The method of claim 6, wherein said second anisotropic plasma etching is performed in a plasma etcher in the pressure range of between about 100 and 500 milliTorr.

9. A method for fabricating electrical contact openings on semiconductor substrates for integrated circuits, comprising the steps of:

providing a semiconductor substrate having device contact areas in and on the surface of said substrate;

depositing an insulating layer on said substrate;

depositing a polysilicon layer on said insulating layer;

forming a photoresist layer on said polysilicon layer;

forming openings in said photoresist layer to said polysilicon layer over said device contact areas on said substrate;

using a first anisotropic plasma etch to etch said polysilicon layer to said insulating layer in said photoresist openings, and thereby forming openings having vertical sidewalls in said polysilicon layer;

performing a second anisotropic plasma etch to etch said insulating layer exposed in said polysilicon openings using an etchant gas mixture that concurrently deposits a polymer layer forming polymer sidewall spacers on said polysilicon layer sidewalls, thereby forming contact openings in said insulating layer to said substrate surface having reduced sizes, said contact openings being less in size than said openings in said photoresist layer;

said etchant gas mixture composed of argon (Ar), trifluoromethane ($CHF_3$), carbon tetrafluoride ($CF_4$) and nitrogen ($N_2$);

removing concurrently said polymer sidewall spacers and remaining portions of said photoresist layer by plasma ashing in oxygen, and thereby completing said electrical contact openings on said substrate.

10. The method of claim 9, wherein said insulating layer is composed of borophosphosilicate glass (BPSG) having a thickness of between about 2000 and 15000 Angstroms.

11. The method of claim 9, wherein said insulating layer is leveled by annealing at a temperature of 800° to 900° C. for about 15 to 30 minutes.

12. The method of claim 9, wherein said polysilicon layer has a thickness of between about 1000 and 4000 Angstroms.

13. The method of claim 9, wherein said photoresist layer has a thickness of between about 8000 and 10000 Angstroms.

14. The method of claim 9, wherein said argon (Ar) has a flow rate of between about 450 and 550 standard cubic centimeters per minute (sccm), said trifluoromethane ($CHF_3$) has a flow rate of between about 20.0 and 50.0 sccm, said carbon tetrafluoride ($CF_4$) has a flow rate of between about 20.0 and 50.0 sccm, and said nitrogen ($N_2$) has a flow rate of between about 0 and 10.0 sccm.

15. The method of claim 9, wherein said second anisotropic plasma etching is performed in a plasma etcher in the pressure range of between about 500 and 1500 milliTorr.

16. A method for fabricating electrical contacts and metal interconnections on semiconductor substrates for integrated circuits, comprising the steps of:

providing a semiconductor substrate having device contact areas in and on the surface of said substrate;

depositing an insulating layer on said substrate;

depositing a polysilicon layer on said insulating layer;

forming a photoresist layer on said polysilicon layer;

forming openings in said photoresist layer to said polysilicon layer over said device contact areas on said substrate;

using a first anisotropic plasma etch to etch said polysilicon layer to said insulating layer in said photoresist openings, and thereby forming openings having vertical sidewalls in said polysilicon layer;

performing a second anisotropic plasma etch to etch said insulating layer exposed in said polysilicon openings using an etchant gas mixture that concurrently deposits a polymer layer forming polymer sidewall spacers on said polysilicon layer sidewalls, thereby forming contact openings in said insulating layer to said substrate surface having reduced sizes, said contact openings being less in size than said openings in said photoresist layer;

removing concurrently said polymer sidewall spacers and remaining portions of said photoresist layer by plasma ashing in oxygen;

depositing a conformal barrier metal layer in said contact openings and elsewhere on said polysilicon layer;

depositing a conducting metal layer on said barrier metal layer;

patterning said conducting metal layer, said barrier metal layer and said polysilicon layer, and thereby completing said electrical contacts and said metal interconnections on said semiconductor substrate.

17. The method of claim 16, wherein said insulating layer is composed of borophosphosilicate glass (BPSG) having a thickness of between about 2000 and 15000 Angstroms.

18. The method of claim 17, wherein said insulating layer is leveled by annealing at a temperature of 800° to 900° C. for about 15 to 30 minutes.

19. The method of claim 16, wherein said polysilicon layer has a thickness of between about 500 and 4000 Angstroms.

20. The method of claim 16, wherein said photoresist layer has a thickness of between about 7000 and 16000 Angstroms.

21. The method of claim 16, wherein said second anisotropic plasma etch gas mixture is composed of argon (Ar), trifluoromethane ($CHF_3$), carbon tetrafluoride ($CF_4$) and nitrogen ($N_2$).

22. The method of claim 21, wherein said argon (Ar) has a flow rate of between about 450 and 550 standard cubic centimeters per minute (sccm), said trifluoromethane ($CHF_3$) has a flow rate of between about 20.0 and 50.0 sccm, said carbon tetrafluoride ($CF_4$) has a flow rate of between 20.0 and 50.0 sccm, and said nitrogen ($N_2$) has a flow rate of between about 0 and 10.0 sccm.

23. The method of claim 21, wherein said second anisotropic plasma etching is performed in a plasma etcher in the pressure range of between about 500 and 1500 milliTorr.

24. The method of claim 16, wherein said barrier metal layer is a refractory metal.

25. The method of claim 16, wherein said conducting metal layer is aluminum/copper (AlCu) alloy.

* * * * *